United States Patent [19]

Ahmed

[11] 4,047,054

[45] Sept. 6, 1977

[54] THYRISTOR SWITCHING CIRCUIT

[75] Inventor: Adel Abdel Aziz Ahmed, Annandale, N.J.

[73] Assignee: RCA Corporation, New York, N.Y.

[21] Appl. No.: 716,537

[22] Filed: Aug. 23, 1976

[51] Int. Cl.² .................................... H03K 17/72
[52] U.S. Cl. ............................ 307/252 J; 307/237; 307/305; 323/22 SC
[58] Field of Search ............... 307/202, 252 A, 252 B, 307/252 G, 252 J, 252 N, 252 W, 305, 237; 323/22 SC

[56] References Cited

U.S. PATENT DOCUMENTS

| 3,553,486 | 1/1971 | Dow | 307/237 X |
| 3,609,413 | 9/1971 | Lane et al. | 307/202 X |

Primary Examiner—John Zazworsky
Attorney, Agent, or Firm—H. Christoffersen; A. L. Limberg; R. G. Coalter

[57] ABSTRACT

A signal to be switched is applied across the conduction path of a thyristor and a trigger signal is applied to the thyristor gate electrode. False triggering, due to transients in either signal, is prevented by a current amplifier connected at the output thereof to the gate electrode and at the input thereof, via separate alternating current conductive paths, to the gate electrode and to one end of the thyristor conduction path.

2 Claims, 3 Drawing Figures

THYRISTOR SWITCHING CIRCUIT

This invention relates to switching circuits and particularly to switching circuits employing thyristors.

A thyristor, such as a semiconductor controlled rectifier (SCR), may be falsely triggered by a voltage transient at its gate terminal greater than a minimum threshold value ($V_t$) or by a voltage transient at its anode terminal having a rate-of-change greater than a minimum value (i.e., the so-called $dV/dt$ device rating).

To prevent false anode triggering it is customary either to limit the anode $dV/dt$ or to select an SCR having a $dV/dt$ rating higher than the expected transient $dV/dt$. The latter approach requires some knowledge of the character of the transients or noise which may be present and such information may not be available. Furthermore, SCR's having high $dV/dt$ ratings may exhibit high trigger current requirements and high unlatching currents due to the use of low-valued gate resistors. Such characteristics may be incompatible with other system requirements. The former approach, limiting $dV/dt$, has numerous disadvantages. As an example, it is customary to limit $dV/dt$ by means of a "snubber" network comprising a resistor and a capacitor connected in series between the SCR anode and cathode terminals. The capacitor must be large to effectively limit $dV/dt$ and the resistor (needed to limit the capacitor discharge current through the SCR) must have a relatively high wattage rating. Moreover, because the snubber network impedance is low, the dynamic power dissipation is high and, in audio switching applications, the signal "feed through" via the snubber network is high also.

To prevent false gate triggering it is customary either to connect a high voltage breakdown device (such as a Zener diode, a diac, a neon lamp, etc.) between the gate and the trigger pulse source or to connect a large capacitor across the gate and cathode terminals. The breakdown device increases the static or direct current threshold voltage (which in some applications may be undesired) and may dissipate substantial amounts of power due to the high voltage drop across the device. A gate-to-cathode capacitor, to be effective, must have high capacitance. Such capacitors are relatively expensive and, because of their bulk, cannot readily be formed in an integrated circuit.

Figure 1:
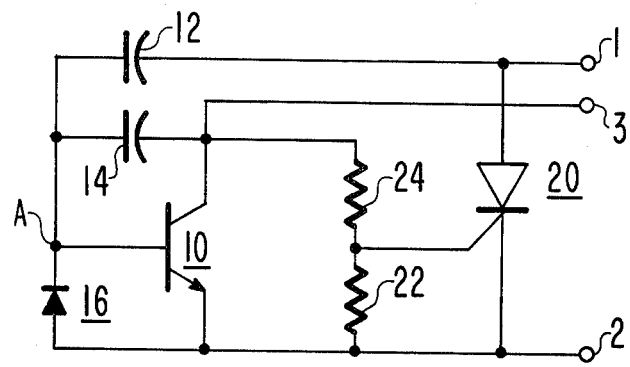
FIG. 1 is a circuit diagram of a switching circuit embodying the invention.

In FIG. 1, NPN transistor 10 is connected at the emitter, base and collector electrodes thereof, respectively, to terminal 2, node A and terminal 3. Node A is coupled to terminal 1 via capacitor 12, to terminal 3 via capacitor 14 and to terminal 2 via diode 16 which is poled in a sense opposite to the base-emitter junction of transistor 10. SCR 20 is connected at the anode and cathode electrodes thereof, respectively, to terminals 1 and 2 and is coupled at the gate electrode thereof to terminal 2 via resistor 22 and to terminal 3 via resistor 24.

Assume that an input signal to be switched is applied across terminals 1 and 2 with terminal 1 being at the more positive potential. Assume, initially, that the input signal has been applied for a period of time such that capacitor 12 is fully charged (via the path including the base-emitter junction of transistor 10), that capacitor 14 is fully discharged (via the path including resistors 22 and 24 and diode 16), that SCR 20 is off and that no trigger signal is applied to terminal 3.

Under these conditions transistor 10 will be off. If a negative transient occurs in the input signal (i.e., a decrease in the potential difference across terminals 1 and 2) a current will flow through capacitor 12 thereby forward biasing diode 16 and reverse biasing the base emitter junction of transistor 10. Accordingly, for negative signal transients transistor 10 remains off and the negative transient is coupled via capacitor 14 and the voltage divider formed by resistors 24 and 22 to the gate of SCR 20 so that SCR 20 remains off also.

It may be noted at this point that diode 16 performs several functions. For example, it provides a path for the negative signal transients conducted by capacitor 12 and directly limits the maximum reverse voltage across the base emitter junction of transistor 10 to a few hundred millivolts (well below the junction breakdown voltage which may be several volts). It further limits the transient gate-to-cathode voltage of SCR 20 for negative going transients at either terminal 1 or terminal 3 (the negative transients are further reduced by the voltage divider comprising resistors 22 and 24).

Summarizing to this point, a negative transient at either of terminals 1 or 3 does not alter the state of transistor 10 or SCR 20. Diode 16 protects the base emitter junction of transistor 10 directly and protects the gate-to-cathode junction of SCR 20 indirectly (via capacitor 14 and resistors 24 and 22).

Assume now that a positive transient occurs in the signal across terminals 1 and 2. In that case the current conducted by capacitor 12 will forward bias the base-emitter junction of transistor 10 thereby clamping terminal 3 to the potential of terminal 2. In effect, this places resistor 24 in parallel with resistor 22 so that the net impedance between the gate and cathode terminals of SCR 20 is greatly reduced. This low impedance path effectively increases the anode $dV/dt$ "withstand capability" of SCR 20. This is fundamentally different from the prior art method of employing a snubber network to directly limit $dV/dt$. Large valued capacitors and high wattage resistors (necessary for snubber networks) are not needed in the circuit of FIG. 1 because capacitor 12 need only conduct a small current to turn on transistor 10 and thus capacitor 12 may be low valued.

To understand the circuit operation for positive transients applied to terminal 3 (relative to terminal 2), it is helpful to observe that transistor 10 is not merely a switching device but is a current amplifier having a current gain which may be expressed in hybrid parameter notation as $h_{FE}$. Since capacitor 14 is connected to provide feedback between the input of the current amplifier (the base of transistor 10) and the output of the amplifier (the collector of transistor 10), the "effective" value of capacitor 14 is multiplied by the current gain of the amplifier. Accordingly, capacitor 14 may be very small and still suppress large positive transients at terminal 3.

To illustrate, assume that terminal 3 is initially at the potential of terminal 2. A transient which would increase the potential at terminal 3 would also increase the potential at node A because of the coupling therebetween provided by capacitor 14. When the node A potential reaches a few hundred millivolts, transistor 10 will begin to withdraw current from terminal 3 proportional to $h_{FE}$ times the current conducted by capacitor 14. Thus, the net current conducted by transistor 10 and capacitor 14 will be equal to $h_{FE} + 1$ and the "effective" value of capacitor 14 will equal $C_{14}(h_{FE} + 1)$ where $C_{14}$ is the actual value of capacitor 14 and $h_{FE}$ is a large number such as 50-100 or more. The overall effect is that transients present at terminal 3 greater than a few hundred millivolts are suppressed (integrated) by an effective capacitance many times as large as capacitor 14. This limits the amplitude of the transient voltage appearing at the input of the voltage divider formed by resistors 24 and 22 which further attenuates the transient.

The potential divider (resistors 24 and 22) is particularly useful in applications where very large transients at terminal 3 are expected or where SCR 20 has a relatively low turn-on threshold voltage because of the additional voltage attenuation it provides. In some cases resistor 22 may be eliminated or resistor 24 may be replaced by a direct connection from the gate of SCR 20 to terminal 3. One way this can be done is to select SCR 10 to have a threshold turn on voltage greater than the minimum expected value which the transient (integrated by capacitor 10 and transistor 20) can attain. Since that value will be greater than the nominal value of the forward biased base-emitter voltage drop of transistor 10 (i.e., $V_{BE}10$), it would be desirable if an alternative were available. One alternative (which allows elimination of resistor 22) is to select resistor 24 such that the maximum gate current supplied to SCR 20 (under the assumption of a maximum expected value of the integrated transient) is less than the minimum turn-on threshold current rating of the particular SCR selected.

Figure 2:
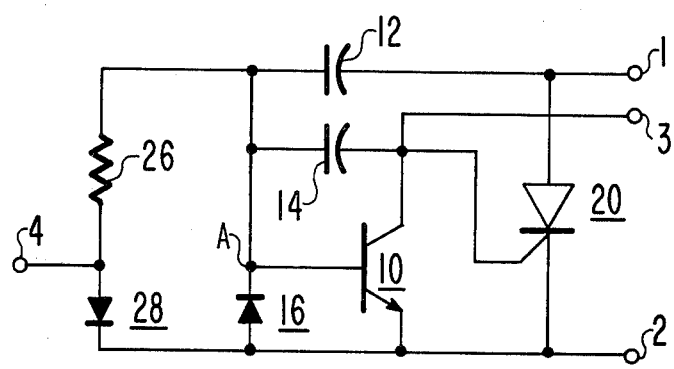
FIGS. 2 and 3 are circuit diagrams illustrating modifications of the circuit of FIG. 1.

A better way, which does not require selection of the SCR for relatively high voltage or current thresholds, in which resistors 22 and 24 may both be eliminated and which, additionally, provides the benefits of capacitance multiplication at much lower voltage levels, is shown in FIG. 2. There resistor 22 has been eliminated, resistor 24 replaced by a direct connection from the SCR 20 gate to terminal 3. What is added is a fourth terminal 4 coupled via a resistor 26 to node A and via a diode 28 to terminal 2, the diode being poled in the same sense relative to terminal 2 as the base-emitter junction of transistor 10.

In operation, the current amplifier (i.e., transistor 10) provides numerous circuit functions in addition to those previously described relating not only to the dynamic operation but to the static operation as well. For example, when a bias current is applied to terminal 4, diode 28 and transistor 10 function as a form of current mirror amplifier. Neglecting the voltage drop across resistor 26, transistor 10 is primed to conduct a current proportional to that conducted by diode 28 multiplied by the ratio of their respective junction areas. Thus, with no signal applied to terminal 3, transistor 10 will (in the steady state condition) be saturated. Three benefits of this are: (1) the anode $dV/dt$ withstand capability of SCR 20 is enhanced because of the effective short circuit across its gate and cathode terminals; (2) transients even less than $V_{BE}$ at terminal 3 are suppressed via conduction through transistor 10; and (3) the threshold current at which SCR 20 is triggered is programmable by varying the bias current i.e., triggering occurs when the average direct current signal applied to terminal 3 exceeds the current which transistor 20 is primed to conduct.

Resistor 26 has little effect on the circuit steady state characteristics. Its main function is to isolate node A from diode 28 for positive transients conducted by capacitors 12 and 14 so that the greater portion of the transient current is amplified by transistor 10. Resistor 26 could be eliminated by replacing it with a further diode connected at the anode thereof to terminal 4 and the cathode thereof to node A (an additional diode in series with diode 28 would be needed, however, to overcome the voltage drop across the further diode). Alternatively, both resistor 26 and diode 28 could be eliminated by connecting terminal 4 directly to node A and applying current to terminal 4 via a suitable high impedance current source. If that were done, the circuit threshold (i.e., the steady state current at terminal 3 required to trigger SCR 20) would equal the sum of the SCR 20 gate current threshold plus $h_{FE}$ times the input bias current applied to terminal 4.

Figure 3:
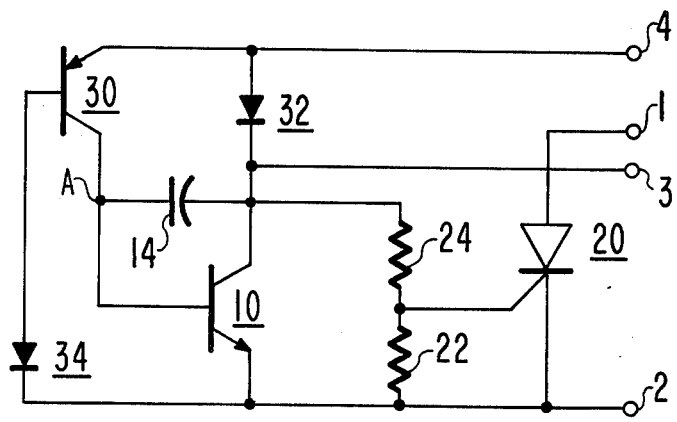

FIG. 3 illustrates another method of modifying the circuit of FIG. 1 to provide variable or "programmable" trigger threshold control in addition to preventing false firing due to trigger signal transients. Unlike the modified circuit of FIG. 2, however, transistor 10 is not saturated under steady state conditions, substantially all of the current conducted by capacitor 14 is applied to the base of transistor 10 and the magnitude of the bias current applied to terminal 4 to achieve a given circuit trigger threshold is substantially reduced.

In FIG. 3, diode 16 and capacitor 12, which were formerly connected between node A and terminals 2 and 1, respectively, have been eliminated from the circuit. Elements added to the circuit include a bias input terminal 4, diodes 32 and 34 and transistor 30. Terminal 4 is coupled to the emitter of transistor 30 and to the anode of diode 32 which is coupled at the cathode thereof to terminal 3. Transistor 30 is connected at its collector directly to node A and at its base to terminal 2 via diode 34, the latter being poled in the same direction as the emitter-base diode of transistor 30.

As an example of the circuit operation, assume that terminal 2 is at ground reference potential, that a positive signal to be switched is applied to terminal 1, that terminal 3 is connected to a source of trigger signals and that a bias current is applied to terminal 4. Assume initially that SCR 20 is off and that the trigger signal source is turned off. Under these conditions a portion of the bias current which flows to terminal 2 via the base-emitter junction of transistor 30 and diode 34, will cause transistor 30 to turn on and its collector current will flow to the base of transistor 10. As a result, transistor 10 is biased on to conduct the greater portion of the bias current to terminal 2 via diode 32.

Now assume that the trigger signal source is turned on to supply an increasing current to terminal 3 and that the rate of change in the trigger current is sufficiently low so that the effect of capacitor 14 may be ignored. Since the trigger current is conducted by transistor 10, there will be a tendency for its collector voltage to increase. At first, that tendency will be counteracted because an increase in the collector voltage will reduce the current conducted by diode 32 which is then diverted via transistor 30 to the base of transistor 10. The current through diode 32 is reduced because its anode is at a relatively fixed potential relative to terminal 2 (i.e., the sum of the forward biased voltage drop across diode 34 and the base-emitter junction of transistor 30).

This "voltage regulating" action continues as the trigger current increases until: (1) a point is reached where diode 32 is essentially non-conductive so that substantially all the bias current is applied to the base of transistor 10 and (2) the magnitude of the trigger current exceeds $h_{FE}$ times the bias current. At that point the current conducted by transistor 10 will cease to increase so that any further increase in trigger current will cause the potential of terminal 3 to increase substantially. Eventually (depending on the values of resistors 22 and 24, and the threshold characteristics of SCR 20) the voltage will reach a value sufficient to trigger SCR 20 into a conductive state.

Trigger signal transients at terminal 3 are suppressed in essentially the same manner as previously described in the discussion of FIG. 1. One difference, however, is that transistor 10 is conductive in the steady-state condition and is normally prevented from saturating by current supplied to its collector via diode 32. Thus, in the steady-state condition, the value of capacitor 14 is multiplied by $h_{FE}$ of transistor 10 and low amplitude transients (i.e., less than one $V_{BE}$) are suppressed as well as high amplitude transients.

As mentioned, bias terminal 4 is connected to a "current" source. Such a source might be a suitably biased bipolar or field effect transistor or it may be a resistor coupled from terminal 4 to a voltage source. One kind of resistor, commonly called a "pinch" resistor, is of particular advantage for supplying current to terminal 4 if the circuit of FIG. 3 is implemented as an integrated circuit. It has been observed that the resistance variation of pinch resistors closely follows the beta variations of NPN transistors where the resistor and transistor are formed on the same substrate. In other words, for a given integrated circuit, if the transistor beta is higher than the nominal design value, the resistance of a pinch resistor will also be higher than its nominal design value. The significance of this, as to FIG. 3, is that expected variations in beta of transistor 10 are compensated for by variations in the pinch resistor so that the circuit current threshold level is accurately predictable.

In each example of the invention an SCR has been illustrated as the preferred thyristor. Alternatively, the SCR may be replaced by other suitable reverse blocking triode thyristors, reverse blocking tetrode thyristors or bidirectional triode thyristors. Although it is preferred that the thyristor be an integrated semiconductor device (typically thyristors are constructed as PNPN structures), it may, alternatively, be formed by suitable combinations of discrete transistors. As an example, it may comprise a pair of complementary (NPN and PNP) bipolar transistors having the collector of each connected to the base of the other.

What is claimed is:

1. A switching circuit comprising, in combination:
   first and second terminals for receiving a signal thereacross to be switched and a third terminal for receiving a trigger signal;
   a thyristor having a main conduction path coupled between said first and second terminals and having also a gate electrode;
   means coupling said gate electrode to said third terminal;
   a node;
   current amplifier means having an input electrode coupled to said node and an output electrode coupled to said third terminal;
   a first capacitor coupled between said node and said first terminal; and
   a second capacitor coupled between said node and said third terminal.

2. The combination recited in claim 1 wherein:
   said thyristor is an SCR connected at the anode and cathode terminals thereof, respectively, to said first and second terminals;
   said means coupling said gate electrode to said third terminal is a potential divider comprising a first resistor connected between said gate electrode and said third terminal and a second resistor connected between said gate electrode and said second terminal;
   said current amplifier means comprises an NPN bipolar transistor connected at the emitter, base and collector electrodes thereof, respectively, to said second terminal, said node and said third terminal; and further comprising:
   a diode connected at the anode and cathode electrodes thereof to said second terminal and said node.

* * * * *